United States Patent [19]
Maruyama

[11] Patent Number: 5,924,050
[45] Date of Patent: Jul. 13, 1999

[54] ARITHMETIC UNIT

[75] Inventor: Ryoji Maruyama, Tokyo, Japan

[73] Assignee: Kabushiki Kaisha Toshiba, Kawasaki, Japan

[21] Appl. No.: 08/807,729

[22] Filed: Feb. 28, 1997

[30] Foreign Application Priority Data

Mar. 1, 1996 [JP] Japan ................................ 8-044877

[51] Int. Cl.$^6$ .......................... G01R 19/25; G01R 21/133
[52] U.S. Cl. .............................................. 702/60; 324/141
[58] Field of Search ..................... 364/480, 483, 364/492, 726.01; 324/140–142, 76.11, 76.12; 702/57, 60, 61

[56] References Cited

U.S. PATENT DOCUMENTS

| | | | |
|---|---|---|---|
| 4,255,707 | 3/1981 | Miller | 324/142 |
| 4,999,799 | 3/1991 | Tufts | 364/726 |
| 5,099,195 | 3/1992 | Greer et al. | 324/142 |
| 5,448,747 | 9/1995 | Garverick et al. | 364/483 X |

FOREIGN PATENT DOCUMENTS

| | | |
|---|---|---|
| 0 308 924 | 3/1989 | European Pat. Off. . |
| 0 510 956 | 10/1992 | European Pat. Off. . |
| 0 634 662 | 1/1995 | European Pat. Off. . |

*Primary Examiner*—Melanie A. Kemper
*Attorney, Agent, or Firm*—Foley & Lardner

[57] ABSTRACT

First and second 1-bit A/D converters convert respective input voltages being in direct proportion to voltage and current of a measurement system into respective 1 bit codes. First and second up-down counters whose up/down count in respective clock terminals are controlled in accordance with respective 1 bit codes which are output from the first and second 1-bit A/D converters, and output A/D converted values of the respective input voltages. A latch holds data one clock prior to currently input data and outputs the data. An adder-subtractor adds and subtracts respective output data of the first and second up-down counters and a numerical value 1 to and from output data of the latch under control of respective output data of the first and second 1-bit A/D converters and an exclusive OR value of the respective output data and outputs arithmetic data which being in proportion to a product of the respective input voltages to the latch. An adder integrates the output data of the latch.

16 Claims, 8 Drawing Sheets

ARITHMETIC UNIT

BACKGROUND OF THE INVENTION

1. Field of the Invention

The present invention relates to an arithmetic unit for calculating electric power or electric energy based on voltage and current of a measurement system.

2. Description of the Prior Art

As an arithmetic unit for calculating electric power or electric energy in the prior art, there has been such an arithmetic unit as shown in FIG. 1, for instance. In FIG. 1, references T1, T2 denote input terminals to which respective voltages V1, A1 which are in direct proportion to voltage and current of a measurement system are input; 201, 202, first and second A/D converters for converting the voltages V1, A1 into respective digital values; and 203, a CPU which multiplies and integrates the digital values output from the first and second A/D converters 201, 202 in terms of software at intervals of a predetermined time. This arithmetic unit can calculate electric power W=V1·A1cos Ψ. Therefore, generally, the arithmetic unit can function as a wattmeter if it integrates the electric power over more than one period and then changes integrated electric power into electric power per unit time, and also function as a watthour meter if it calculates the electric power in terms of infinite integral with respect to time.

In contrast, if reactive power should be calculated by the arithmetic unit, phase shift of 90° is required since Q=V1·A1sin Ψ has to be calculated. In the prior art, the CPU 203 has handled shifting process of the voltage V1 to calculate reactive power because the voltage V1 can be phase-shifted more easily in practical use.

However, in the case that both electric power and reactive power have to be calculated by the arithmetic unit in the prior art, there have been various problems as follows.

(a) It takes a lot of time to process multiplication instruction since multiplication has been executed in terms of software incorporated into the CPU.

(b) Software is busy in calculation since multiplication has been executed in terms of software incorporated into the CPU, so that it is hard for the CPU to execute other tasks.

(c) It is difficult to increase the sampling frequency since A/D conversion takes a lot of time because the A/D converters are employed. Also, if the bit number required for the A/D converters must be increased to improve conversion precision, it takes a lot of time to convert and in addition the arithmetic unit becomes expensive.

Further, particularly, in the case that reactive power is calculated, since data of the voltage V1 is phase-shifted in terms of software incorporated into the CPU, all 16 bits must be phase-shifted if the outputs of the A/D converters are 16 bit data, for example. There has been another problem that complicated process and excessive memories and registers are needed.

SUMMARY OF THE INVENTION

The present invention has been made in view of the above circumstances, and it is an object of the present invention to provide an arithmetic unit capable of constituting a wattmeter and a watthour meter by means of hardwares as a whole, or reducing a size of the CPU by minimizing software processes to thus achieve low cost as a system, reducing a size of the arithmetic unit, if formed as an LSI, because of fewer analogue devices to thus achieve low cost in this respect, and achieving performance with higher precision by increasing a sampling frequency higher.

It is another object of the present invention to provide an arithmetic unit capable of calculating reactive power only by adding a simple phase-shift circuit as a hardware to the above arithmetic unit for use in calculation of effective power.

In order to achieve the above objects, there is provided an arithmetic unit which comprises a first 1-bit A/D converter and a second 1-bit A/D converter for converting respective input voltages which are in direct proportion to voltage and current of a measurement system into respective 1 bit codes; a first up-down counter and a second up-down counter whose up/down count in respective clock terminals are controlled in accordance with said respective 1 bit codes which are output from said first 1-bit A/D converter and said second 1-bit A/D converter, and for outputting A/D converted values of said respective input voltages; a latch for holding data which is ahead of currently input data by one clock and outputting said data; an adder-subtractor for adding/subtracting respective output data of said first up-down counter and second up-down counter and a numerical value 1 to/from output data of said latch under control of respective output data of said first 1-bit A/D converter and second 1-bit A/D converter and an exclusive OR value of said respective output data to output arithmetic data, which is in proportion to a product of said respective input voltages, to said latch; and an adder for integrating said output data of said latch.

According to the above configuration, respective input voltages which are in direct proportion to voltage and current of a measurement system are converted into respective 1 bit codes by virtue of the first 1-bit A/D converter and the second 1-bit A/D converter. A/D converted values of the respective input voltages can be obtained by virtue of the first up-down counter and the second up-down counter. Calculated data which is proportional to a product of the input voltages can be obtained based on the A/D converted values. An electric energy (watthour) can be measured by adding the calculated data by virtue of the adder. Since the electric energy arithmetic unit can be constructed by all hardwares, calculation can be effected without interposition of software incorporated into the CPU. Since very few devices, that is, only the 1-Bit A/D converters, are needed as an analogue portion, the arithmetic unit can be made small in size if formed as an LSI. In addition, a higher precision operation can be attained in the A/D converter portion if a sampling frequency is made higher.

In a preferred embodiment of the present invention, data output from said adder is cleared at intervals of a predetermined time. According to this configuration, an electric power arithmetic unit can be accomplished.

In order to achieve the above objects, in addition to the above configuration, there is provided the arithmetic unit which further comprises a delay circuit provided between said first 1-bit A/D converter and said first up-down counter, for delaying output data of said first 1-bit A/D converter by a ¼ phase time of an input voltage which is in direct proportion to said voltage of said measurement system to output delayed output data to said first up-down counter.

According to this configuration, a reactive electric energy arithmetic unit which has the similar advantages to those of the above electric energy arithmetic unit can be accomplished.

In order to achieve the above objects, in addition to the above configuration, there is provided the arithmetic unit which further comprises a frequency detecting circuit for detecting sequentially a frequency of said input voltage which is in direct proportion to said voltage of said measurement system, and for supplying information of said frequency to said delay circuit.

According to this configuration, even if the frequency of the voltage of the measurement system is varied, precise time delay of ¼ phase can be effected precisely.

In a preferred embodiment of the present invention, said delay circuit comprises a plurality of shift registers connected in series and operated in synchronism with a clock Ø as a reference signal and an output signal of said first 1-bit A/D converter being input into a first stage of said plurality of shift registers, a decoder for decoding an output signal of said frequency detecting circuit, a plurality of AND gates having one input terminals for receiving an output signal of said decoder and other input terminals for receiving respective output signals of said plurality of shift registers, and an OR gate for receiving respective output signals of said plurality of AND gates.

In a preferred embodiment of the present invention, data output from said adder is cleared at intervals of a predetermined time. According to this configuration, a reactive electric power arithmetic unit can be accomplished In the preferred embodiment of the present invention, at least part of functions of said first up-down counter, said second up-down counter, said latch, said adder-subtractor, and said adder are executed in terms of software of the CPU.

According to this configuration, the arithmetic unit can be accomplished which is able to calculate electric energy, electric power, reactive electric energy, and reactive electric power with high precision and at low cost at least rather than the arithmetic unit in the prior art.

The nature, principle and utility of the invention will become more apparent from the following detailed description when read in conjunction with the accompanying drawings.

BRIEF DESCRIPTION OF THE DRAWINGS

In the accompanying drawings:

FIGS. 3A to 3G are diagrams showing waveforms in respective portions to explain an operation of the arithmetic unit according to the first embodiment of the present invention;

DESCRIPTION OF THE PREFERRED EMBODIMENTS

Embodiments of the present invention will be explained in detail with reference to the accompanying drawings hereinafter.

Figure 1:
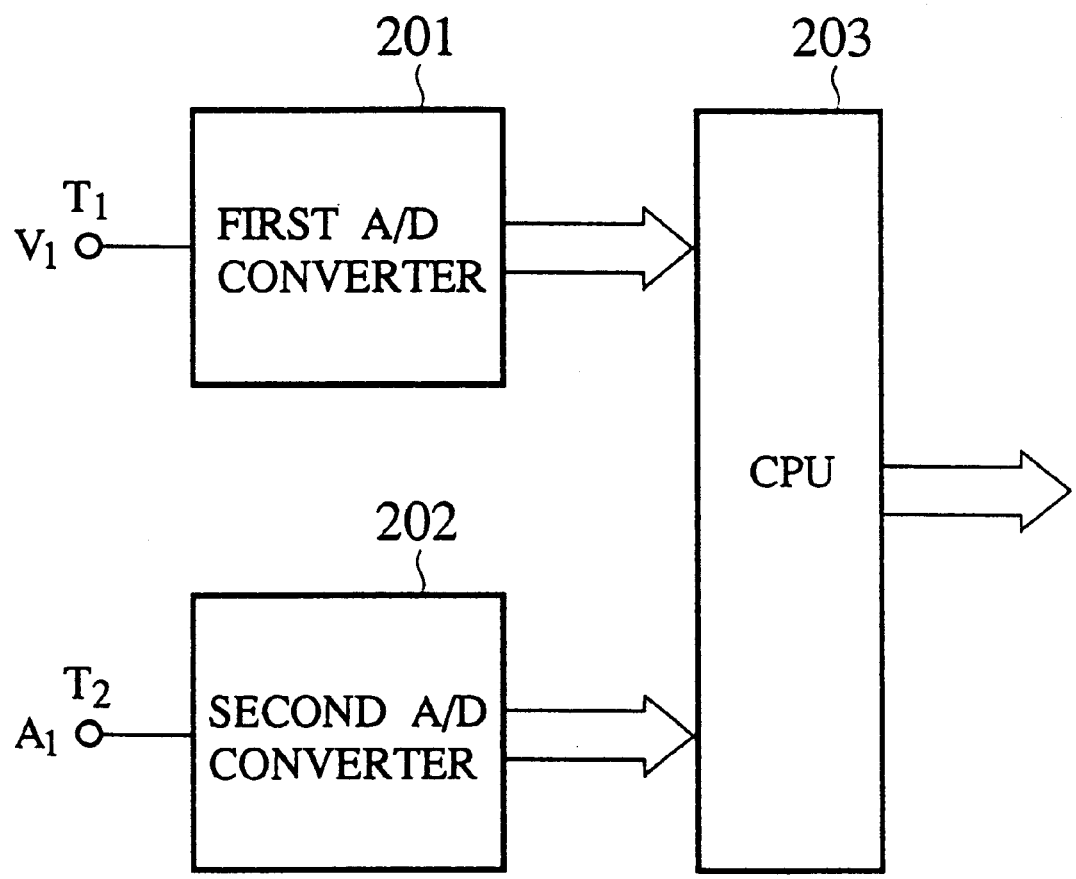
FIG. 1 is a block circuit diagram showing an arithmetic unit in the prior art.
Figure 2:
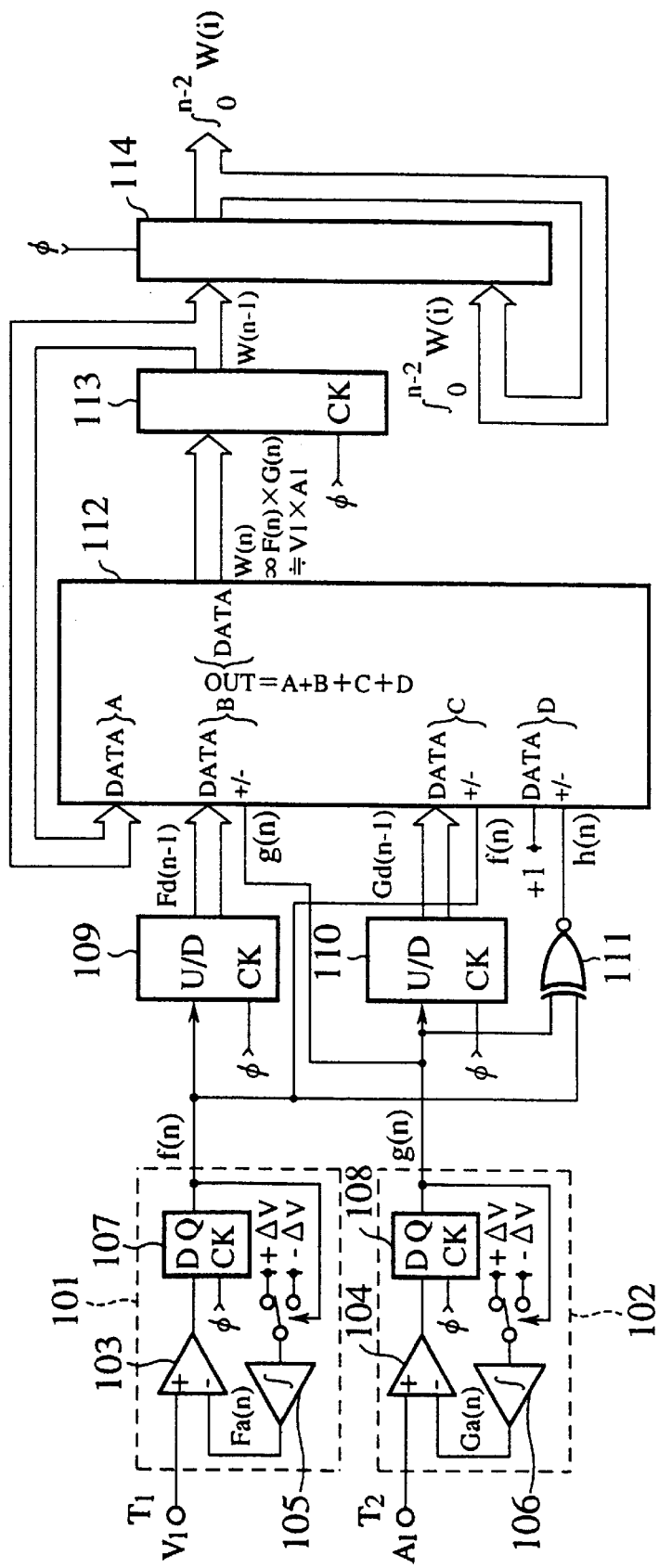
FIG. 2 is a block circuit diagram showing a configuration of an arithmetic unit according to a first embodiment of the present invention.

FIG. 2 shows a configuration of an arithmetic unit according to a first embodiment of the present invention. In FIG. 2, references T1, T2 denote input terminals to which respective voltages V1, A1 which being in direct proportion to voltage and current of a measurement system are input. References 101, 102 denote first and second 1-bit A/D converters called delta modulators in which comparators 103, 104, integrators 105, 106, and D-type flip-flops 107, 108 are built respectively and which encode (code) input voltages V1, A1 into pulse trains f(n), g(n) respectively and then output them. Output timings of the first and second 1-bit A/D converters 101, 102 are determined in synchronism with clocks Ø. More particularly, in the first (or second) 1-bit A/D converter 101 (or 102), the comparator 103 (or 104) compares output voltage F(n) (or G(n)) of the integrator 105 (or 106) with the input voltage V1 (or A1) at the rise time of the clock Ø and then outputs a H level signal via the D-type flip-flop 107 (or 108) if V1>Fa(n) (or A1>Ga(n)), and thereafter an output of the integrator 105 (or 106) is incremented by +Δv. In contrast, the comparator 103 (or 104) outputs an L level signal via the D-type flip-flop 107 (or 108) if V1<Fa(n) (or A1<Ga(n)), and thereafter an output of the integrator 105 (or 106) is incremented by −Δv, i.e., is decremented by +Δv. References 109, 110 denote first and second up-down counters in which up/down count is controlled in accordance with outputs f(n), g(n) of the 1-bit A/D converters 101, 102 and counts the number of the clock Ø. Outputs of the first and second up-down counters 109, 110 are given as Fd(n−1), Gd(n−1) which are A/D converted values of said respective input voltages V1,·A1. A reference 111 denotes an exclusive OR gate which outputs an exclusive OR output h(n) of the outputs f(n), g(n) of the first and second 1-bit A/D converters 101, 102. A reference 112 denotes an adder-subtractor which adds and subtracts four inputs A, B, C, and D (i.e., an output value W(n−1)of a latch 113, an output value Fd(n−1) of the first up-down counter 109, an output value Gd(n−1) of the second up-down counter 110, and a numerical value 1). For the inputs B, C, and D of the adder-subtractor 112, either addition and subtraction would be determined depending upon respective signals (i.e., g(n), f(n), h(n)) input into (±) terminals of the adder-subtractor 112. That is, addition is carried out if the (±) terminal is at an H level while subtraction is carried out if the (±) terminal is at an L level. An output of the adder-subtractor 112 is given as a value W(n) which is in proportion to a product V1·A1 of instantaneous input voltages. A reference 113 denotes a latch which latches, based on the clock Ø, the signal W(n−1) of the adder-subtractor 112 which is ahead of the output W(n) by one clock. A reference 114 denotes an adder which carries out, at the timing of the clock Ø, addition of the output W(n−1) of the latch 113 and a total sum of the adder 114 per se from zero to one clock before, i.e., an integral value of W(i) which is the integral from 1 to (n−2) of W(i) of i. As a result, the integral value ∫ W(i) of the multiplication value of instantaneous input voltages V1, A1 can be obtained.

Figure 3A:
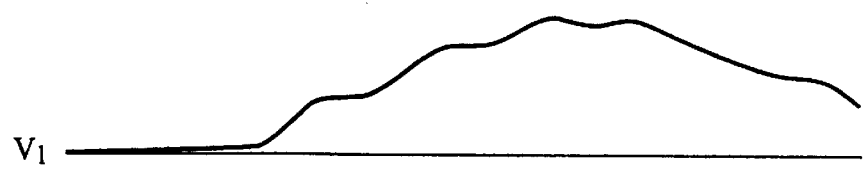
Figure 3B:
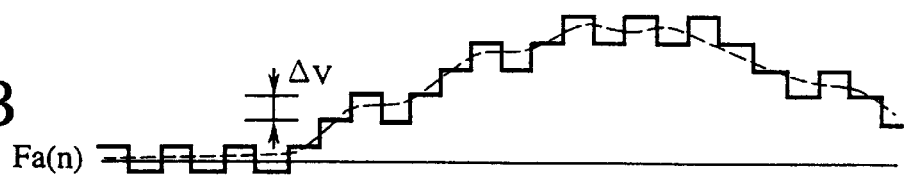
Figure 3B:
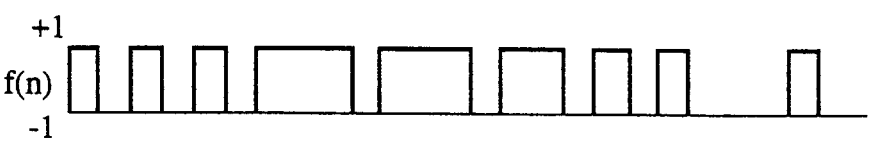
Figure 3D:
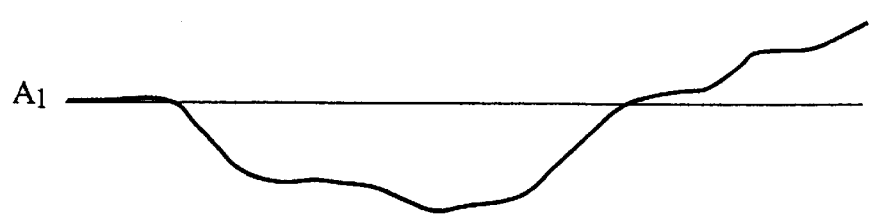
Figure 3E:
Figure 3E:
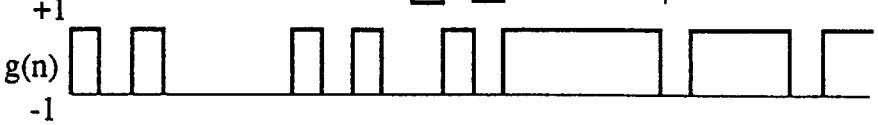
Figure 3E:
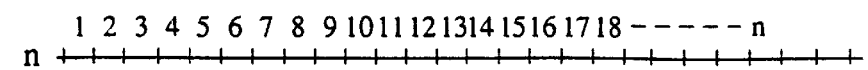

Next, an operation of the arithmetic unit constituted as above will be explained with reference to FIGS. 3A to 3G. FIGS. 3A to 3G show waveforms in respective portions of the arithmetic unit. V1 in FIG. 3A and A1 in FIG. 3D are voltages which are in direct proportion to voltage and current of the measurement system respectively. f(n) in FIG. 3C and g(n) in FIG. 3F are pulses obtained by delta-modulating V1, A1 respectively. The values of the pulses are limited to only +1 or −1. Fa(n) in FIG. 3B and Ga(n) in FIG. 3E are outputs of the integrators 105, 106 in the first and second 1-bit A/D converters 101, 102, which are coded values of respective input voltages V1, A1. Where n in FIG. 3G represents the n-th order in FIGS. 3A to 3F.

It is the object of the arithmetic unit according to the first embodiment that is to calculate the product V1·A1 of input voltages. Since V1 is substantially identical to F(n) and A1 is substantially identical to G(n), F(n)·G(n)=W(n) may be defined. Suppose that the outputs of the first 1-bit A/D converter 101 up to the n-times operation are f(1), f(2), f(3), . . . , f(n), an output voltage Fa(n) of the integrator 105 can be expressed at that time by $$Fa(n) = (f(1)+f(2)+f(3)+\ldots+f(n))\cdot \Delta V \quad (1)$$

Further, since up-down count of the output of the first up-down counter 109 is controlled by f(n) to count up the number of clock Ø, the output can be derived as a value Fd which is a digital coded Fa(n). But the (n−1)-th value Fd(n−1) in place of the value Fd(n) would be output in connection with the clock Ø. The value F(n)·G(n)=W(n) to be calculated here can be expressed by $$\begin{aligned}W(n) &= F(n)\cdot G(n) \\ &= (f(1)+f(2)+f(3)+\ldots+f(n))\cdot(g(1)+g(2)+g(3)+\ldots+g(n)) \\ &= (F(n-1)+f(n))\cdot(G(n-1)+g(n))\end{aligned} \quad (2)$$

Where Eq. (2) can be expressed by following four cases (I) to (IV) since f(n)=±1 and g(n)=±1 in Eq.(2).

(I) If f(n)=+1 and g(n)=+1, then $$\begin{aligned}W(n) &= (F(n-1)+f(n))\cdot(G(n-1)+g(n)) \\ &= F(n-1)\cdot G(n-1)+F(n-1)+G(n-1)+1 \\ &= W(n-1)+F(n-1)+G(n-1)+1\end{aligned} \quad (3)$$

(II) If f(n)=+1 and g(n)=−1, then $$\begin{aligned}W(n) &= (F(n-1)+f(n))\cdot(G(n-1)+g(n)) \\ &= F(n-1)\cdot G(n-1)-F(n-1)+G(n-1)-1 \\ &= W(n-1)-F(n-1)+G(n-1)-1\end{aligned} \quad (4)$$

(III) If f(n)=−1 and g(n)=+1, then $$\begin{aligned}W(n) &= (F(n-1)+f(n))\cdot(G(n-1)+g(n)) \\ &= F(n-1)\cdot G(n-1)+F(n-1)-G(n-1)-1 \\ &= W(n-1)+F(n-1)-G(n-1)-1\end{aligned} \quad (5)$$

(IV) If f(n)=−1 and g(n)=−1, then $$\begin{aligned}W(n) &= (F(n-1)+f(n))\cdot(G(n-1)+g(n)) \\ &= F(n-1)\cdot G(n-1)-F(n-1)-G(n-1)+1 \\ &= W(n-1)-F(n-1)-G(n-1)+1\end{aligned} \quad (6)$$

Therefore, after the output data W(n) of the adder-subtractor 112 is sampled as W(n−1) by the latch 113 by making use of one clock delay in the clock Ø, if addition and subtraction of the output data W(n−1) of the latch 113, the output data Fd(n−1) of the first up-down counter 109, the output data Gd(n−1) of the second up-down counter 110, and a numerical value 1 are effected by the adder-subtractor 112, then W(n) can be calculated.

Referring to FIGS. 4a to 4d, the meaning of the adding and subtracting calculation will be plainly explained here. The above cases (I) to (IV) respectively correspond to FIGS. 4a to 4d. In each Figure, the portion surrounded by solid lines corresponds to W(n), and the portion surrounded by dotted lines corresponds to W(n−1). The portion with hutch slanting below right corresponds to F(n−1), and the portion with hutch slanting below left corresponds to G(n−1).

Figure 4A:
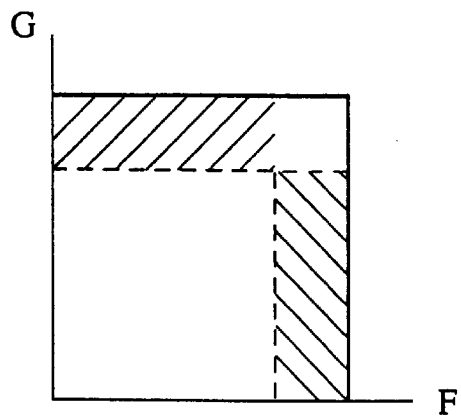
FIGS. 4A to 4D are diagrams showing the meaning of adding and subtracting calculation in an adder-subtractor according to the present invention.
Figure 4B:
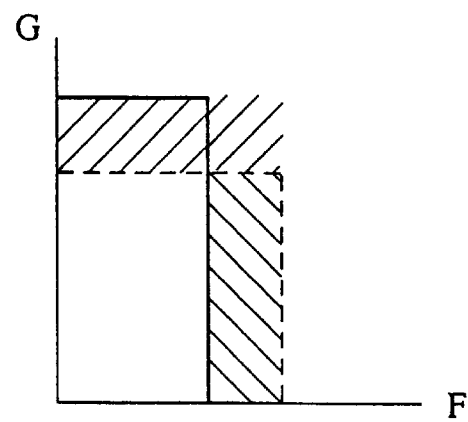
Figure 4C:
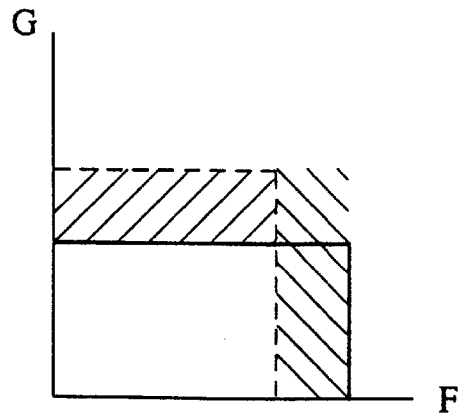
Figure 4D:
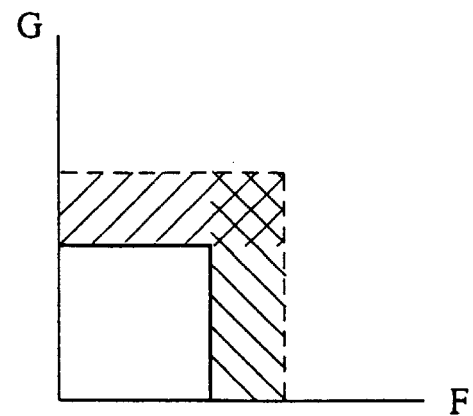

In the above case of (I), as shown in FIG. 4A, in order to acquire W(n), even if F(n−1) and G(n−1) are added to W(n−1), a shortage of 1 occurs, therefore 1 is added. In the above case of (II), as shown if FIG. 4B, in order to acquire W(n), when F(n−1) is subtracted from W(n−1), and G(n−1) is added to the result, then an excessive addition of 1 occurs, therefore 1 is subtracted. In the above case of (III), as shown if FIG. 4C, in order to acquire W(n), when F(n−1) is added to W(n−1), and G(n−1) is subtracted from the result, then an excessive addition of 1 occurs, therefore 1 is subtracted. n the above case of (IV), as shown in FIG. 4D, in order to acquire W(n), when F(n−1) and G(n−1) are subtracted from W(n−1), a shortage of 1 occurs, therefore 1 is added.

Addition and subtraction of respective output data Fd(n−1), Gd(n−1) and 1 are controlled by g(n), f(n), h(n) (i.e., EXnor of f(n) and g(n)) respectively. Hence, the output data of the adder-subtractor 112 can be derived as the value W(n) which is proportional to the product V1·A1 of input voltages. In addition, since this W(n) is a n-th instantaneous multiplication value of V1, A1, an integral value of V1·A1= W(n) or W(n−1) is needed to calculate actually electric power and electric energy. To that end, the adder 114 executes the integral by adding W(n−1) and output data of the adder 114 itself, i.e., an integral value from 1 to (n−2) of W(i) of i.

In the first embodiment having the above structure and advantages, in case the adder 114 executes the infinite integral, an electric energy arithmetic unit for measuring electric energy can be accomplished.

As stated above, according to the first embodiment, since the electric energy arithmetic unit can be constructed by all hardwares, calculation can be effected without interposition of software incorporated into the CPU, which leads to reduction in size of the CPU. Since very few devices, i.e., only the 1-Bit A/D converters, are needed as the analogue devices, the arithmetic unit can be made small in size if it is manufactured as an LSI, which leads to low cost of the arithmetic unit. In addition, a higher precision operation can be attained in the A/D converter portion if the sampling frequency is made higher.

Moreover, if the adder 114 is cleared every time a certain fixed time, say one second, has elapsed, or every time several periods of the alternating signal to be measured have been counted and then a resultant integrated value is converted into a value per unit time, an electric power arithmetic unit for measuring electric power can be accomplished.

Further, if part or all of processes are executed in terms of software of the CPU in the stages succeeding to the first and second up-down counters 109, 110, the electric energy arithmetic unit or the electric power arithmetic unit can be manufactured at low cost. In particular, it is practical and effective to execute processes in the stages succeeding to the adder-subtractor 112 in terms of software of the CPU.

Figure 8:
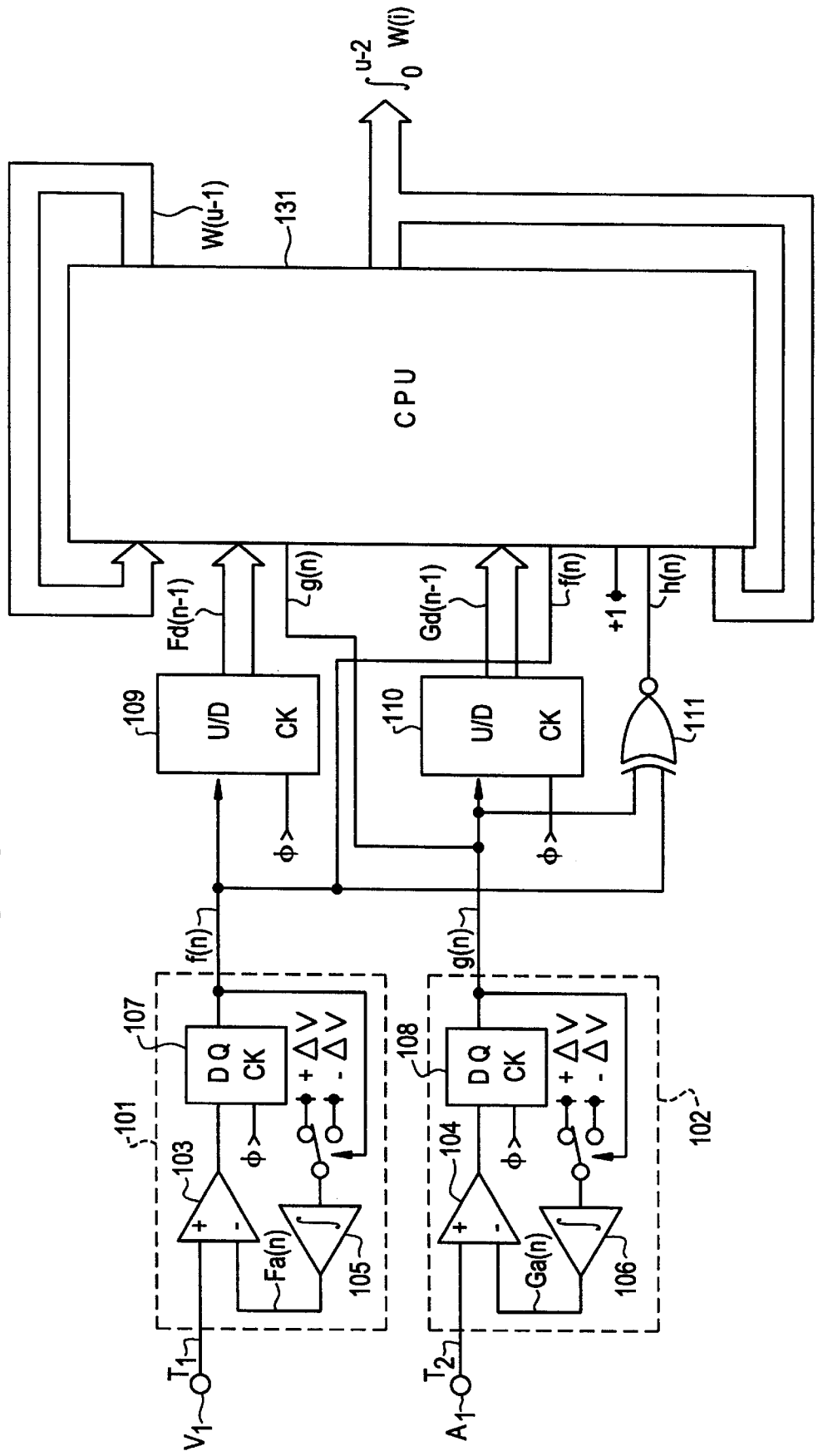
FIG. 8 is a block circuit diagram showing a configuration of an arithmetic unit according to a modified embodiment of the first embodiment.

The particular mode is shown in FIG. 8, in which the functions of the adder-subtractor 112, the latch 113 and the adder 114 in FIG. 2 are incorporated into a CPU 131.

In the first embodiment, the output W(n) of the adder-subtractor 112 may be used instead of the output W(n−1) of the latch 113 as the input data of the adder 114. Also the same operation and advantages as in the above can be achieved if the delta modulators (1-bit A/D converters 101, 102) consist of delta-sigma modulators.

Figure 5:
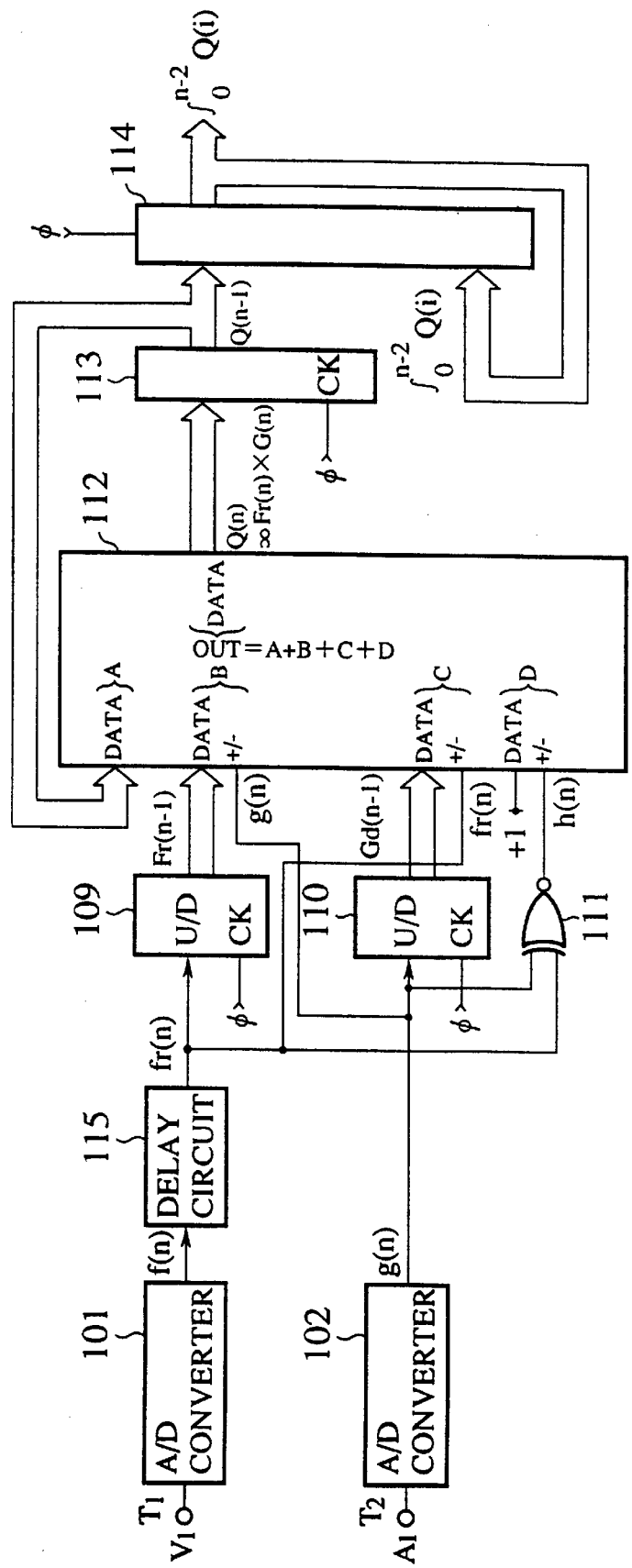
FIG. 5 is a block circuit diagram showing a configuration of an arithmetic unit according to a second embodiment of the present invention.

FIG. 5 shows a configuration of an arithmetic unit according to a second embodiment of the present invention, which can calculate reactive electric power or reactive electric energy. As stated earlier, although phase-shift of 90° is needed to calculate reactive electric power or reactive electric energy, a delay circuit 115 is provided between the first 1-bit A/D converter 101 and the first up-down counter 109 in the second embodiment. The delay circuit 115 can be, for example, made up of shift register, digital PLL, CCD, etc. The delay circuit 115 delays the output f(n) of the first 1-bit A/D converter 101 by a ¼ phase time of the signal which is input into the terminal T1 (e.g., 5 ms if a frequency of the signal is 50 Hz) and then output the delayed output f(n) as a signal fr(n).

Operations of the first and second 1-bit A/D converters 101, 102, the first and second up-down counters 109, 110, the adder-subtractor 112, the latch 113, and the adder 114 are similar to those used in the first embodiment. However, in the second embodiment, since the signal f(n) is phase-shifted by 90° by means of the delay circuit 115, the adder-subtractor 112 calculates Fr(n)·G(n) and, as a result, reactive electric power or reactive electric energy can be calculated.

Figure 6:
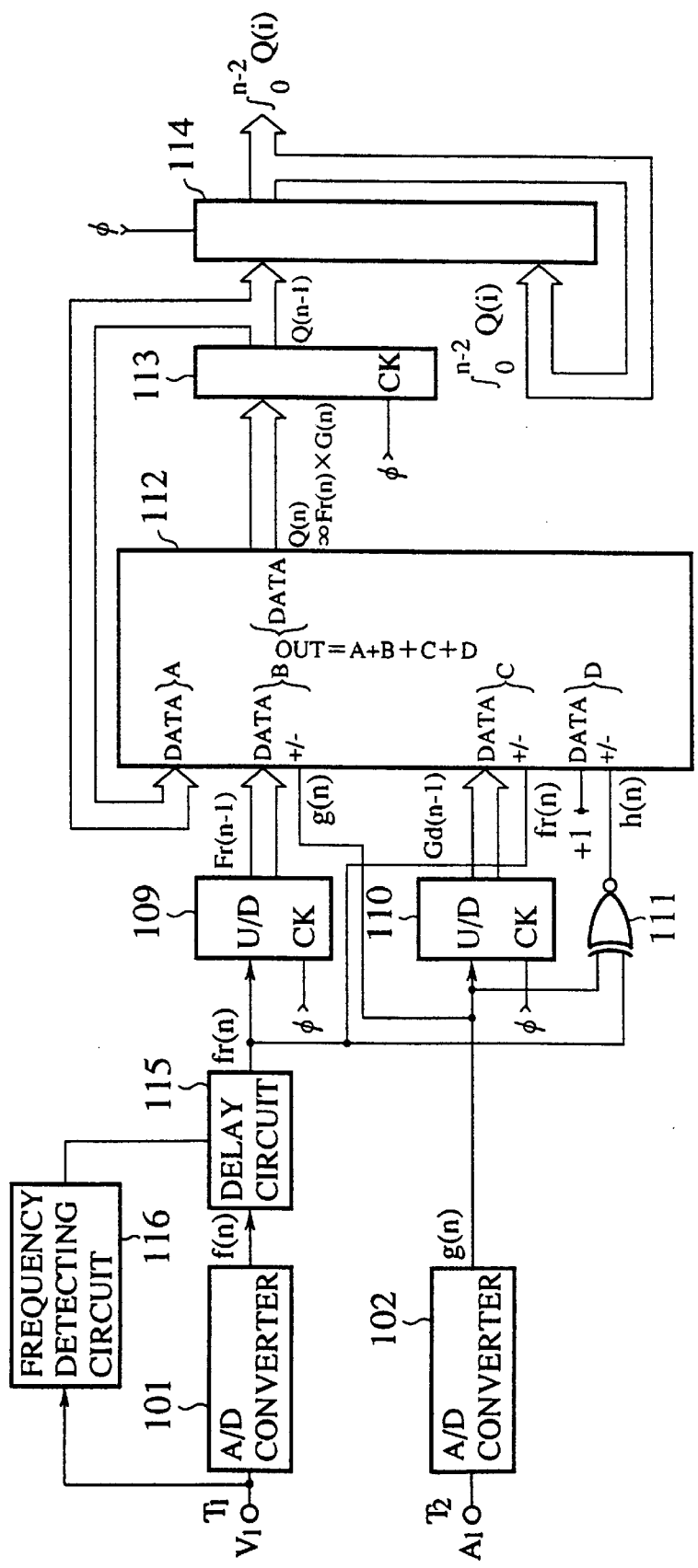
FIG. 6 is a block circuit diagram showing a configuration of an arithmetic unit according to a third embodiment of the present invention.

FIG. 6 shows a configuration of an arithmetic unit according to a third embodiment of the present invention. In the third embodiment, a frequency detecting circuit 116 is further added to the configuration of the second embodiment. The frequency detecting circuit 116 detects sequentially a frequency of the signal V1 and then supplies resultant information to the delay circuit 115. Because the delay circuit 115 can receive frequency information of the signal V1 from the frequency detecting circuit 116, phase-shift of the signal f(n) can be conducted precisely.

Figure 7:
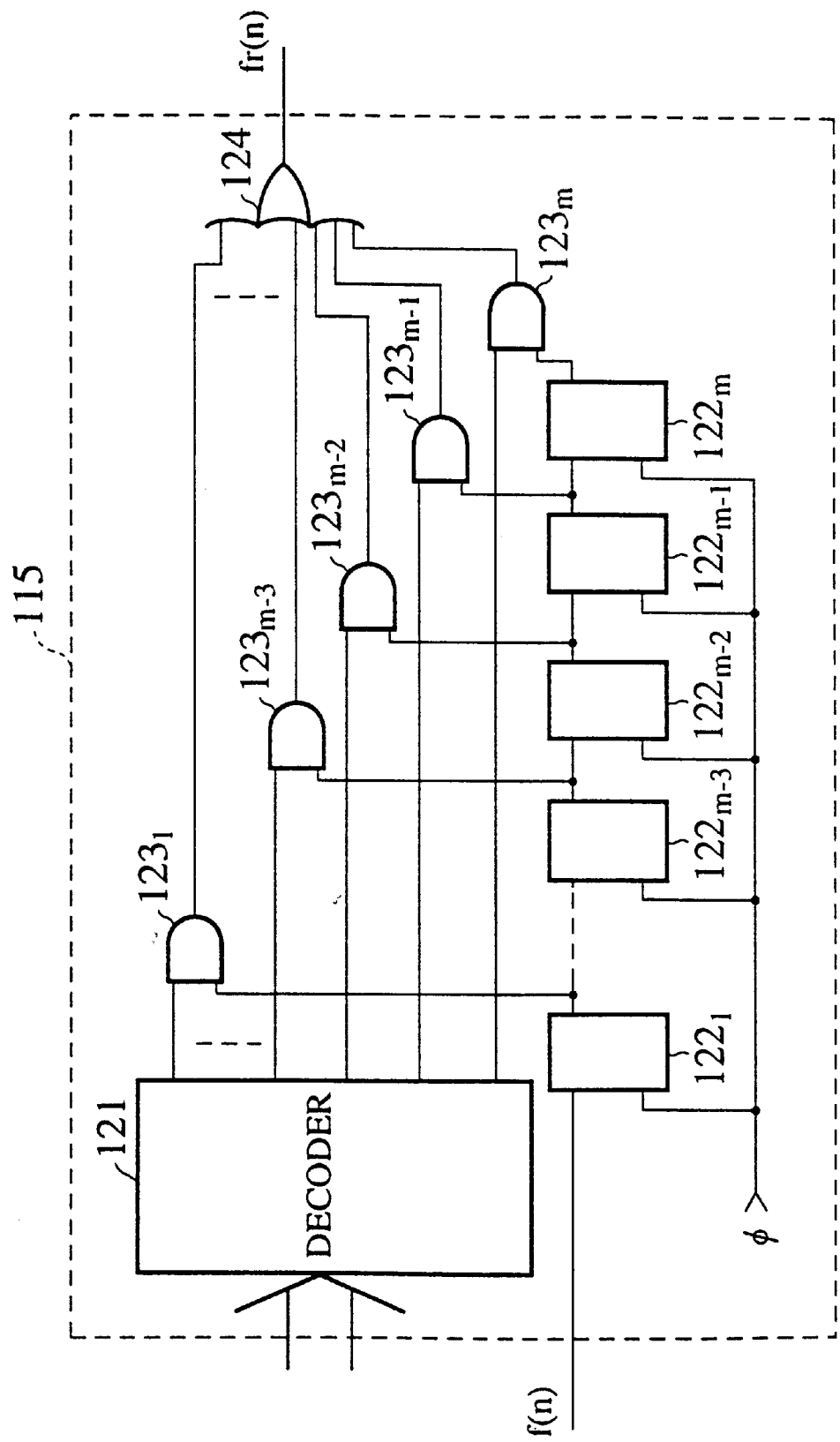
FIG. 7 is a circuit diagram showing an example of a delay circuit used in the arithmetic unit according to the third embodiment of the present invention.

FIG. 7 shows an example of a detailed configuration of the delay circuit 115 in the third embodiment of the present invention. In FIG. 7, the delay circuit 115 comprises a plurality of shift registers 122 connected in serial with each other and operated based on the clock Ø as a reference signal, and the output signal f(n) of the first 1-bit A/D converter 101 being input into the first stage of the shift registers; a decoder 121 for decoding the signal output from the frequency detecting circuit 116; a plurality of AND gates 123 having one input terminals for receiving the output signal of the decoder 121 respectively and other input terminals for receiving respective output signals of the plurality of shift registers 122; and an OR gate 124 for receiving respective output signals from the plurality of AND gates 123.

The AND gates 123 and the OR gate 124 may select the output from the appropriate stage out of the plurality of shift registers 122 and then output the output as the signal fr(n). According to such configuration, even if the frequency of the signal V1 fluctuates, the signal f(n) can be phase-shifted precisely in accordance with frequency information supplied from the frequency detecting circuit 116.

It should be understood that many modifications and adaptations of the invention will become apparent to those skilled in the art and it is intended to encompass such obvious modifications and changes in the scope of the claims appended hereto.

What is claimed is:

1. An arithmetic unit comprising:
   a first 1-bit A/D converter and a second 1-bit A/D converter for converting respective input voltages which are in direct proportion to voltage and current of a measurement system into respective 1 bit codes;
   a first up-down counter and a second up-down counter whose up/down count in respective clock terminals are controlled in accordance with said respective 1 bit codes which are output from said first 1-bit A/D converter and said second 1-bit A/D converter, and for outputting A/D converted values of said respective input voltages;
   a latch for holding data which is ahead of currently input data by one clock and outputting said data;
   an adder-subtractor for adding/subtracting respective output data of said first up-down counter and second up-down counter and a numerical value 1 to/from output data of said latch under control of respective output data of said first 1-bit A/D converter and second 1-bit A/D converter and an exclusive OR value of said respective output data to output arithmetic data which is in proportion to a product of said respective input voltages to said latch; and
   an adder for integrating said output data of said latch.

2. An arithmetic unit according to claim 1, wherein data output from said adder is cleared at intervals of a predetermined time.

3. An arithmetic unit according to claim 1, further comprising a delay circuit provided between said first 1-bit A/D converter and said first up-down counter, for delaying output data of said first 1-bit A/D converter by a ¼ phase time of an input voltage, which is in direct proportion to said voltage of said measurement system, to output delayed output data to said first up-down counter.

4. An arithmetic unit according to claim 3, further comprising a frequency detecting circuit for detecting sequentially a frequency of said input voltage, which is in direct proportion to said voltage of said measurement system, and for supplying information of said frequency to said delay circuit.

5. An arithmetic unit according to claim 4, wherein said delay circuit comprises,
   a plurality of shift registers connected in series and operated in synchronism with a clock Ø as a reference signal, and an output signal of said first 1-bit A/D converter being input into a first stage of said plurality of shift registers,
   a decoder for decoding an output signal of said frequency detecting circuit,
   a plurality of AND gates having one input terminals for receiving an output signal of said decoder and other input terminals for receiving respective output signals of said plurality of shift registers, and
   an OR gate for receiving respective output signals of said plurality of AND gates.

6. An arithmetic unit according to claim 3, wherein data output from said adder is cleared at intervals of a predetermined time.

7. An arithmetic unit according to claim 4, wherein data output from said adder is cleared at intervals of a predetermined time.

8. An arithmetic unit according to claim 5, wherein data output from said adder is cleared at intervals of a predetermined time.

9. An arithmetic unit comprising:
   a first 1-bit A/D converter and a second 1-bit A/D converter for converting respective input voltages which are directly proportional to voltage and current of a measurement system into respective 1 bit codes;

a first up-down counter and a second up-down counter whose up/down count in respective clock terminals are controlled in accordance with said respective 1 bit codes which are output from said first 1-bit A/D converter and said second 1-bit A/D converter, and for outputting A/D converted values of said respective input voltages; and a CPU for holding data which is ahead of currently input data by one clock, adding/subtracting respective output data of said first up-down counter and second up-down counter and a numerical value 1 to/from the held data under control of respective output data of said first 1-bit A/D converter and second 1-bit A/D converter and an exclusive OR value of said respective output data to obtain arithmetic data which is in proportion to a product of said respective input voltages, holding the arithmetic data, and integrating the held data.

10. An arithmetic unit according to claim 9, wherein data output from said CPU is cleared at predetermined intervals.

11. An arithmetic unit according to claim 9, further comprising a delay circuit provided between said first 1-bit A/D converter and said first up-down counter, for delaying output data of said first 1-bit A/D converter by a ¼ phase time of an input voltage, which is in direct proportion to said voltage of said measurement system, to output delayed output data to said first up-down counter.

12. An arithmetic unit according to claim 11, further comprising a frequency detecting circuit for detecting sequentially a frequency of said input voltage, which is in direct proportion to said voltage of said measurement system, and for supplying information of said frequency to said delay circuit.

13. An arithmetic unit according to claim 12, wherein said delay circuit comprises:

a plurality of shift registers connected in series and operated in synchronism with a clock $\emptyset$ as a reference signal, and an output signal of said first 1-bit A/D converter being input into a first stage of said plurality of shift registers, a decoder for decoding an output signal of said frequency detecting circuit, a plurality of AND gates each having one input terminal for receiving an output signal of said decoder and another input terminal for receiving respective output signals of said plurality of shift registers, and an OR gate for receiving respective output signals of said plurality of AND gates.

14. An arithmetic unit according to claim 11, wherein data output from said CPU is cleared at predetermined intervals.

15. An arithmetic unit according to claim 12, wherein data output from said CPU is cleared at predetermined intervals.

16. An arithmetic unit according to claim 13, wherein data output from said CPU is cleared at predetermined intervals.

* * * * *